United States Patent [19]
Kwon

[11] Patent Number: 5,663,914
[45] Date of Patent: Sep. 2, 1997

[54] MODE ADAPTIVE DATA OUTPUT BUFFER FOR SEMICONDUCTOR MEMORY DEVICE

[75] Inventor: Jung Tae Kwon, Kyoungki-do, Rep. of Korea

[73] Assignee: Hyundai Electronics Industries Co., Ltd., Kyoungki-do, Rep. of Korea

[21] Appl. No.: 673,211

[22] Filed: Jun. 27, 1996

[30] Foreign Application Priority Data

Jun. 30, 1995 [KR] Rep. of Korea ............... 95-18863

[51] Int. Cl.⁶ ................................ G11C 7/00
[52] U.S. Cl. ..................... 365/202; 365/189.05
[58] Field of Search ............. 365/202, 189.05, 365/190, 233.5

[56] References Cited

U.S. PATENT DOCUMENTS

| | | | |
|---|---|---|---|
| 5,073,872 | 12/1991 | Masuda | 365/189.05 |
| 5,311,076 | 5/1994 | Park | 365/189.05 |
| 5,315,173 | 5/1994 | Lee et al. | 307/443 |
| 5,325,330 | 6/1994 | Morgan | 365/189.05 |
| 5,414,312 | 5/1995 | Wong | 326/83 |

*Primary Examiner*—David C. Nelms
*Assistant Examiner*—Son Mai
*Attorney, Agent, or Firm*—Gary M. Nath; Nath & Associates

[57] ABSTRACT

A mode adaptive data output buffer for a semiconductor memory device, the semiconductor memory device having a plurality of memory cells for storing data therein, comprising true end complementary data lines for inputting true and complementary data read from the memory cells, respectively, a control line for inputting an output enable signal for controlling the output of the true and complementary data read from the memory cells, first and second pull-up drivers connected in parallel between a first voltage source and an output line, first and second pull-down drivers connected in parallel between a second voltage source and the output lane, a PMOS transistor for switching the second pull-up driver to the output line, an NMOS transistor for switching the second pull-down driver to the output line, and a controller for detecting the input order of the true and complementary data read from the memory cells and the output enable signal and controlling the PMOS and NMOS transistors in accordance with the detected result. The controller includes a data transition detector and a latch circuit. According to the present invention, the mode adaptive data output buffer is capable of performing a high-speed operation and minimizing the generation of noise regardless of a data mode.

8 Claims, 1 Drawing Sheet

MODE ADAPTIVE DATA OUTPUT BUFFER FOR SEMICONDUCTOR MEMORY DEVICE

BACKGROUND OF THE INVENTION

1. Field of the Invention

The present invention relates, in general, to a data output buffer for amplifying data read from a semiconductor memory device and transferring the amplified data to the peripheral circuit, and more particularly, to a mode adaptive data output buffer for a semiconductor memory device which is capable of performing a high-speed operation and minimizing the generation of noise regardless of a data mode.

2. Description of the Prior Art

Generally, a semiconductor memory device such as a dynamic random access memory or a static random access memory comprises a data output buffer for amplifying data read from a memory cell so that it can have a voltage level required by the peripheral circuit. The data output buffer can generate output data (referred to hereinafter as "2-level data"), which has a voltage level Vcc of high logic and a voltage level Vss of low logic. Alternatively, the data output buffer can generate output data (referred to hereinafter as "3-level data"), which varies with the voltage level Vss of low logic and the voltage level Vcc of high logic on the basis of a voltage level (about 1.4 V) of high impedance state which is a reference level.

Such a conventional data output buffer may employ a circuit device with a large current amount, to enhance the operation speed. In this case, the conventional data output buffer generates 3-level data which has little noise at its edge portion. However, the conventional data output buffer generates 2-level data, which has excessive noise at its edge portion. Such excessive noise results in a degradation of the response speed of output data with respect to input data. The reason is that the 2-level data has a wider swing width whereas the 3-level data has a narrower swing width.

The conventional data output buffer may employ a circuit device with a small current amount to minimize the generation of noise at the edge portion of the 2-level data. In this case, the response speed of the 3-level data with respect to input data is significantly degraded.

As mentioned above, the conventional data output buffer has the disadvantage that the operation speed is degraded and the noise component is increased, according to the output data mode.

SUMMARY OF THE INVENTION

Therefore, the present invention has been made in view of the above problems, and it is an objective of the present invention to provide a mode adaptive data output buffer for a semiconductor memory device which is capable of performing a high-speed operation and minimizing the generation of noise regardless of the data mode.

In accordance with the present invention, the above and other objects can be accomplished by a provision of a mode adaptive data output buffer for a semiconductor memory device, the semiconductor memory device having a plurality of memory cells for storing data therein, comprising true and complementary data lines for inputting true and complementary data read from the memory cells, respectively; a control line for inputting an output enable signal for controlling the output of the true and complementary data read from the memory cells; first and second pull-up drivers connected in parallel between a first voltage source and an output line; first and second pull-down drivers connected in parallel between a second voltage source and the output line; first switching means for switching the second pull-up driver to the output line; second switching means for switching the second pull-down driver to the output line; and control means for detecting the input order of the true and complementary data read from the memory cells and the output enable signal and controlling the first and second switching means in accordance with the detected result.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
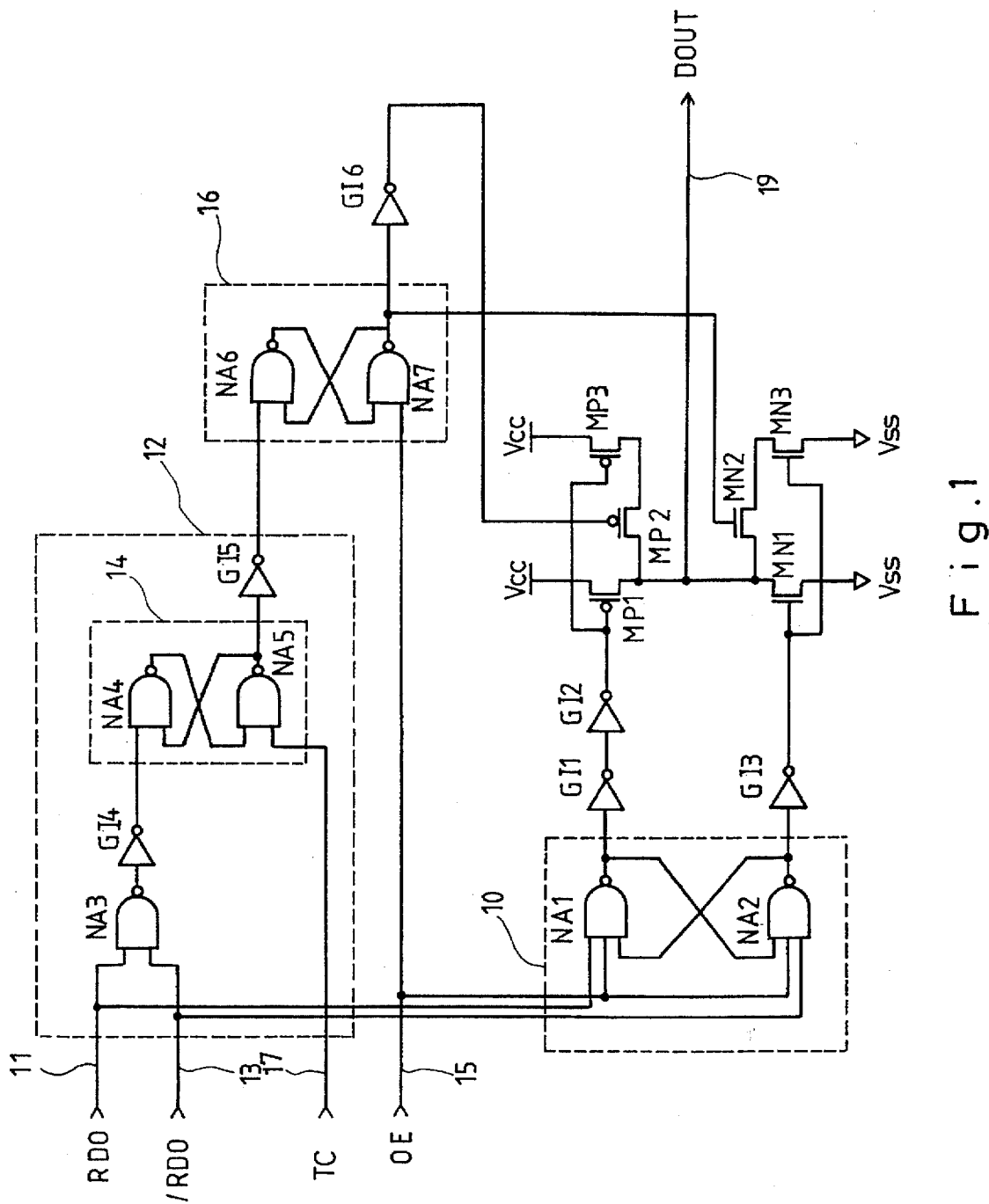
FIG. 1 is a circuit diagram illustrating the construction of a mode adaptive data output buffer for a semiconductor memory device in accordance with an embodiment of the present invention.

FIG. 1 is a circuit diagram illustrating the construction of a mode adaptive data output buffer for a semiconductor memory device in accordance with the preferred embodiment of the present invention. As shown in this drawing, the mode adaptive data output buffer comprises true and complementary data lines 11 and 13 for inputting true and complementary data RDO and /RDO read from memory cells (not shown), respectively, a first control line 15 for inputting an output enable signal OE for controlling the output of the true and complementary data RDO and /RDO read from the memory cells, and a second control line 17 for inputting a transition detection control signal TC. The output enable signal OE is generated in response to a column address strobe bar signal/CAS which is externally applied to the semiconductor memory device. The transition detection control signal TC is generated in response to a row address strobe bar signal/RAS which is externally applied to the semiconductor memory device. A data mode is determined according to a time point that the true and complementary read data RDO and /RDO are inputted to the true and complementary data lines 11 and 13 and a time point that the output enable signal OE is made active high in logic. Namely, if the output enable signal active time point is earlier than the read data input time point, a first data mode is designated to generate 2-level data on an output line 19. To this end, if the read data input time point is earlier than the output enable signal active time point, a second data mode is designated to generate 3-level data on the output line 19.

The mode adaptive data output buffer further comprises first and second pull-up PMOS transistors MP1 and MP3 connected in parallel between a first voltage source Vcc and the output line 19, first and second pull-down NMOS transistors MN1 and MN3 connected in parallel between a second voltage source Vss and the output line 19, and a first latch circuit 10 for inputting the true and complementary read data RDO and /RDO from the true and complementary data lines 11 and 13 and the output enable signal OE from the first control line 15. When the output enable signal OE from the first control line 15 is high in logic, the first latch circuit 10 inverts the true read data RDO from the true data line 11 and supplies the inverted true read data to an inverter series circuit of inverters GI1 and GI2. The inverter series circuit provides its output signal in common to gates of the first and second pull-up PMOS transistors MP1 and MP3. Also, the first latch 10 inverts the complementary read data/RDO from the complementary data line 13 and supplies the inverted complementary read data to an inverter GI3. The inverter GI3 again inverts the inverted complementary read data from the first latch circuit 10 and applies the resultant complementary read data in common to gates of the first and second pull-down NMOS transistors MN1 and MN3.

The first and second pull-up PMOS transistors MP1 and MP3 transfer a voltage from the first voltage source Vcc to the output line 19 when the output signal from the inverter GI2 is low in logic. The first and second pull-down NMOS transistors MN1 and MN3 transfer a voltage from the second voltage source Vss to the output line 19 when the output signal from the inverter GI3 is high in logic. In the first data mode, the first and second pull-up PMOS transistors MP1 and MP3 are driven complementarily to the first and second pull-down NMOS transistors MN1 and MN3. However, in the second data mode, the first and second pull-up PMOS transistors MP1 and MP3 are turned off simultaneously with the first and second pull-down NMOS transistors MN1 and MN3, to allow the output line 19 to remain at its high impedance state (about 1.4 V). Also, the first and second pull-up PMOS transistors MP1 and MP3 are driven complementarily to the first and second pull-down NMOS transistors MN1 and MN3 to generate high or low logic data on the output line 19.

The mode adaptive data output buffer further comprises a transition detector 12 for detecting transitions of the true and complementary read data RDO and /RDO from the true and complementary data lines 11 and 13. The transition detector 12 includes a NAND gate NA3 for NANDing the true and complementary read data RDO and/RDO from the true and complementary data lines 11 and 13, an inverter GI4 for inverting an output signal from the NAND gate NA3, a second latch circuit 14 for latching an output signal from the inverter GI4, and an inverter GI5 for inverting an output signal from the second latch circuit 14. The mode adaptive data output buffer further comprises a third latch circuit 16 for latching an output signal from the transition detector 12. In the transition detector 12, the NAND gate NA3 generates a transition detection signal of high logic when any one of the true and complementary read data RDO and /RDO from the true and complementary data lines 11 and 13 is low in logic. The transition detection signal indicates that the true and complementary data have been inputted. The transition detection signal from the NAND gate NA3 is inverted by the inverter GI4 and applied to the second latch circuit 14. When the transition detection control signal TC from the second control line 17 is high in logic, the second latch circuit 14 latches the inverted transition detection signal from the inverter GI4 and supplies the latched, inverted transition detection signal to the inverter GI5 which then inverts it again. The transition detection signal from the inverter GI5 is high in logic when the true and complementary data have been inputted.

The third latch circuit 16 is adapted to latch the transition detection signal from the transition detector 12 in response to the output enable signal OE from the first control line 15. In the first data mode in which the output enable signal active time point is earlier than the read data input time point, the third latch circuit 16 generates a switching control signal which is changed from high to low in logic at the moment that the output enable signal OE from the first control line 15 is inputted.

On the contrary, in the second data mode in which the output enable signal active time point is later than the read data input time point, the third latch circuit 16 generates a switching control signal which always remains at its high logic state. Each of the first to third latch circuits 10, 14 and 16 are provided with two NAND gates NA1 and NA2, NA4 and NA5, or NA6 and NA7.

The mode adaptive data output buffer further comprises a PMOS transistor MP2 for selectively connecting the second pull-up PMOS transistor MP3 to the output line 19, and an NMOS transistor MN2 for selectively connecting the second pull-down NMOS transistor MN3 to the output line 19. When the switching control signal from the third latch circuit 16 is high in logic, the NMOS transistor MN2 connects the second pull-down NMOS transistor MN3 to the output line 19 to reduce a resistance between the second voltage source Vss and the output line 19. At this time, the amount of current flowing from the second voltage source Vss to the output line 19 is greatly increased, thereby causing the response speed of output data on the output line 19 to be increased. On the other hand, an inverter GI6 inverts the switching control signal from the third latch circuit 16 and applies the inverted switching control signal to a gate of the PMOS transistor MP2. When the inverted switching control signal from the inverter GI6 is low in logic, the PMOS transistor MP2 connects the second pull-up PMOS transistor MP3 to the output line 19 to reduce a resistance between the first voltage source Vcc and the output line 19. At this time, the amount of current flowing from the first voltage source Vcc to the output line 19 is greatly increased, thereby causing the response speed of output data on the output line 19 to be increased.

On the other hand, when the switching control signal from the third latch circuit 16 is low in logic, the NMOS transistor MN2 disconnects the second pull-down NMOS transistor MN3 from the output line 19, to increase the resistance between the second voltage source Vss and the output line 19. At this time, the amount of current flowing from the second voltage source Vss to the output line 19 is greatly reduced, thus, no noise is generated at the edge of output data on the output line 19. Also, when the inverted switching control signal from the inverter GI6 is high in logic, the PMOS transistor MP2 disconnects the second pull-up PMOS transistor MP3 from the output line 19 to increase resistance between the first voltage source Vcc and the output line 19. At this time, the amount of current flowing from the first voltage source Vcc to the output line 19 is greatly reduced, thus, no noise is generated at the edge of output data on the output line 19.

As is apparent from the above description, according to the present invention, the resistances of the pull-up and pull-down MOS transistors are varied according to the data mode. With this connection, in the case where the mode adaptive data output buffer generates output data with a wider swing width, it limits the amount of current to minimize the generation of noise. However, in the case where the mode adaptive data output buffer generates output data with a narrower swing width, it increases the amount of current to enhance the operation speed. Therefore, the mode adaptive data output buffer of the present invention has the effect of performing the high-speed operation and minimizing the generation of noise, regardless of the data mode.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A mode adaptive data output buffer for a semiconductor memory device, said semiconductor memory device having a plurality of memory cells for storing data therein, comprising:

true and complementary data lines for inputting true and complementary data read from said memory cells, respectively;

a control line for inputting an output enable signal for controlling the output of the true and complementary data read said memory cells;

first and second pull-up drivers connected in parallel between a first-voltage source and an output line;

first and second pull-down drivers connected in parallel between a second voltage source and said output line;

first switching means for switching said second pull-up driver to said output line;

second switching means for switching said second pull-down driver to said output line; and control means for detecting the input order of the true and complementary data read from said memory cells and the output enable signal, and controlling said first and second switching means in accordance with the detected result.

2. A mode adaptive data output buffer for a semiconductor memory device, as set forth in claim 1, wherein said control means includes:

data transition detection means for monitoring variations of the true and complementary read data from said true and complementary data lines to detect transitions thereof; and first latch means for latching an output signal from said data transition detection means to said first and second switching means in response to the output signal from said data transition detection means and the output enable signal from said control line.

3. A mode adaptive data output buffer for a semiconductor memory device, as set forth in claim 2, wherein said data transition detection means includes:

logic means for performing a logic operation with respect to the true and complementary read data from said true and complementary data lines; and second latch means for latching an output signal from said logic means to said first latch means.

4. A mode adaptive data output buffer for a semiconductor memory device, as set forth in claim 3, wherein said logic means includes an AND gate for performing an AND operation with respect to the true and complementary read data from said true and complementary data lines.

5. A mode adaptive data output buffer for a semiconductor memory device, as set forth in claim 3, wherein each of said first and second latch means includes a plurality of NAND gates.

6. A mode adaptive data output buffer for a semiconductor memory device, as set forth in claim 1, further comprising another latch means for latching the true and complementary read data from said true and complementary data lines to said first and second pull-up drivers and said first and second pull-down drivers in response to the output enable signal from said control line.

7. A mode adaptive data output buffer for a semiconductor memory device, as set forth in claim 6, further comprising:

first buffering means for buffering the true read data latched by said latch means and supplying the buffered true read data to said first and second pull-up drivers; and second buffering means for buffering the complementary read data latched by said latch means and supplying the buffered complementary read data to said first and second pull-down drivers.

8. A mode adaptive data output buffer for a semiconductor memory device, as set forth in claim 7, wherein said second buffering means include an inverter for inverting the complementary read data latched by another said latch means.

* * * * *